(12) United States Patent
Yoshida et al.

(10) Patent No.: US 7,164,180 B2
(45) Date of Patent: Jan. 16, 2007

(54) MAGNETORESISTIVE RANDOM-ACCESS MEMORY DEVICE

(75) Inventors: Hiroshi Yoshida, Kawanishi (JP); Kazunori Sato, Minoh (JP)

(73) Assignee: Japan Science and Technology Agency, Saitama (JP)

( * ) Notice: Subject to any disclaimer, the term of this patent is extended or adjusted under 35 U.S.C. 154(b) by 0 days.

(21) Appl. No.: 10/518,391

(22) PCT Filed: Jun. 11, 2003

(86) PCT No.: PCT/JP03/07447

§ 371 (c)(1),
(2), (4) Date: Jan. 13, 2006

(87) PCT Pub. No.: WO03/107424

PCT Pub. Date: Dec. 24, 2003

(65) Prior Publication Data

US 2006/0177947 A1    Aug. 10, 2006

(30) Foreign Application Priority Data

Jun. 18, 2002 (JP) .............................. 2002-177540

(51) Int. Cl.
*H01L 29/82*   (2006.01)
*H01L 43/08*   (2006.01)

(52) U.S. Cl. ................ 257/421; 365/158; 257/295; 257/425; 257/E43.004

(58) Field of Classification Search ............... 257/295, 257/421, 425, E43.004, E21.663–E21.665; 365/145, 158
See application file for complete search history.

(56) References Cited

U.S. PATENT DOCUMENTS 5,962,905 A * 10/1999 Kamiguchi et al. ......... 257/421
6,445,024 B1 * 9/2002 Kwon et al. ................ 257/421

(Continued)

FOREIGN PATENT DOCUMENTS

JP           11-135857           5/1999

(Continued)

OTHER PUBLICATIONS

C. Mitra et al.; Journal of Applied Physics, vol. 91, No. 10, pp. 7715-7717, May 15, 2002. Cited in the international search report.

(Continued)

*Primary Examiner*—Kenneth Parker
*Assistant Examiner*—Matthew C Landau
(74) *Attorney, Agent, or Firm*—Westerman, Hattori, Daniels & Adrian, LLP.

(57) ABSTRACT

Disclosed is a new type of magnetoresistive random-access memory (MRAM) device using a magnetic semiconductor, which is capable of achieving high-integration and energy saving in a simplified structure without any MOS transistor, based on a rectification effect derived from a p-i-n type low-resistance tunneling-magnetoresistance-effect (low-resistance TMR) diode with a structure having a p-type half-metallic ferromagnetic semiconductor, an n-type half-metallic ferromagnetic semiconductor and at least one atomic layer of nonmagnetic insulator interposed therebetween, or a rectification effect derived from a p-n type low-resistance tunneling-magnetoresistance-effect (low-resistance TMR) diode with a structure devoid of the interposed atomic layer of nonmagnetic insulator.

12 Claims, 4 Drawing Sheets

Ferromagnetic Tunneling Junction (P - n type)

U.S. PATENT DOCUMENTS

| | | | |
|---|---|---|---|
| 6,778,425 | B1 | 8/2004 | Odagawa et al. |
| 2002/0057594 | A1 | 5/2002 | Hirai |

FOREIGN PATENT DOCUMENTS

| | | |
|---|---|---|
| JP | 2000-106462 | 4/2000 |
| JP | 2000-196030 | 7/2000 |
| JP | 2002-141481 | 5/2002 |
| JP | 2003-229614 | 8/2003 |
| JP | 2003-248909 | 9/2003 |
| WO | WO01/24289 | 4/2001 |

OTHER PUBLICATIONS

H. Boeve et al.; Electronics Letters, vol. 34, No. 18, pp. 1754-1755, Sep. 3, 1998. Cited in the international search report.

R. C. Sousa et al.; IEEE Transactions on Magnetics, vol. 35, No. 5, pp. 2832-2834, Sep. 1999. Cited in the international search report.

* cited by examiner

Ferromagnetic Tunneling Junction (P - i - n type)

Ferromagnetic Tunneling Junction (P - n type)

MAGNETORESISTIVE RANDOM-ACCESS MEMORY DEVICE

TECHNICAL FIELD

The present invention relates to a new type of magnetoresistive random-access memory (MRAM) device which uses a p-n junction diode formed of half-metallic ferromagnetic semiconductor and includes no MOS transistor.

BACKGROUND ART

A conventional MRAM using a thin film of metallic magnetic material includes two types, one type utilizing a giant magnetoresistance effect (GMR) and the other type utilizing a tunneling magnetoresistance effect (TMR). An electrical resistance between two magnetic layers located adjacent to one another through a nonmagnetic layer is relatively low when the magnetization orientations of the two magnetic layers are parallel, and is increased when the magnetization orientations of the two magnetic layers are anti-parallel. These phenomenons are utilized to differentiate "1" and "0", respectively. In a writing operation, a given current is supplied to each of a bit line and a word line to invert the magnetization orientation of the magnetic layer with a higher coercive force in a memory cell at the intersection between the bit and word lines by a current magnetic field. The "1" or "0" is set according to the inverted magnetization orientation. In a reading operation, the magnetization orientation of the magnetic layer with a lower coercive force is inverted by a current magnetic field to determine the "1" or "0" based on the effect of GMR or TMR.

The MRAM using a GMR element is more easily prepared. In addition, the GMR element itself is a conductor, and thereby a plural number of the GMR elements can be connected in series with each other to facilitate increase in its memory capacity. However, if N-memory cells exist along a single bit line, each of the memory cells will receive only 1/N of a signal voltage. Thus, an excessive increase in the number N causes difficulties in the reading operation due to disappearance of the signal voltage into noises. Moreover, in the GMR element having a low resistance, a signal voltage itself is inherently low, and thereby it is required to provide a reading amplifier having a larger amplification capacity, which leads to increase in cost and chip size. This is a problem in applications to customer devices, and consequently the GMR memory is used only as military and space devices under extremely limited conditions.

A series connection as in the GMR element cannot be applied to the MRAM using a TMR element due to a high resistance of the TMR element, and a parallel connection has to be used therefor. Typically, in this type of MRAM, a MOS transistor is combined with the TMR element to form a memory cell, because in the absence of the MOS transistor, a current applied to bit and word lines will be supplied to not only a selected memory cell but also the remaining cells.

The MOS transistor is required to carry out a switching function essential in selecting an intended memory element. Thus, the memory size of the MRAM is determined by the dimensional size of the MOS transistor. This is a realistic major issue in connection with achievement of a larger-capacity MRAM, and one of factors obstructive to practical use of the MRAM.

The memory cell has a configuration similar to a DRAM (Dynamic Random-Access Memory), in which the TMR element is used in place of a capacitor. While the fundamental configuration of the memory cell is also similar to a FeRAM (Ferroelectric Random-Access Memory), one bit in the FeRAM is composed of two transistors and two ferroelectric elements to cope with an unsolved problem about large variations. Thus, the memory cell size per bit is increased, and thereby it is difficult to achieve high-integration.

At present, a TMR element using a thin film of metallic magnetic material has a magnetoresistance change rate (MR rate) of about 50%. This MR rate is not varied depending on the dimensions of the TMR element. In a DRAM, a capacitance is lowered as the dimensions of an element are reduced. While the MR rate in the MRAM is not varied depending on the dimensions of the TMR element, a capacitance in a DRAM is lowered as the dimensions of an element are reduced.

The MRAM allows for high-speed access because the spin-flip therein occurs within one nanosecond. Specifically, the MRAM allows writing/reading operations to be performed at a higher speed than that in a DRAM, and in a non-destructive manner.

Further, the thin film for the TMR element can be formed at room temperatures. This eliminates the risk of causing the destruction of the MOS transistor during the film forming process. In contrast, one of reasons for difficulties in achieving a larger-capacity FeRAM is in that a ferroelectric film can be formed only at a high temperature of 500° C. or more.

The MRAM also has a feature of allowing a number of rewriting operations without problems. In addition, the MRAM is usable in nuclear reactors and outer space because of its excellent nuclear radiation resistance.

As above, the MRAM can perform writing/reading operations at a high speed in a non-volatile manner, and facilitate increase in its memory capacity. However, in a conventional MRAM using a thin film of metallic ferromagnetic material, when a memory cell size is reduced, the intensity of a current magnetic field required for magnetization inversion has to be increased. This is a problem in developing a larger-capacity MRAM, and one of factors obstructive to practical use of the MRAM.

While the variation of a TMR value can be controlled to fall within 2%, the magnetic field for magnetization inversion is largely varied. Further, as to a heat stability of the TMR element, while a maximum MR rate is achieved at an annealing temperature of 300° C., the conventional MRAM has to be typically subjected to a heat treatment at a temperature of 400° C. in a hydrogen atmosphere to recover damages in a CMOS transistor due to microfabrication and/or patterning of metal wirings. During this heat treatment, the MR rate of the TMR element becomes zero. Thus, it is required to improve the heat resistance of the TMR element or reduce the temperature for the heat treatment of the CMOS transistor.

There is another problem about microfabrication for use in a thin film of metallic magnetic material. Specifically, while the thin film is microfabricated through physical cutting by means of lithography and ion milling ion as a technique for research, such a technique cannot be applied to large-scale productions. It is essential for the large-scale production of MRAM devices to develop a production technique based on a dry etching process or chemical reaction etching which is used for semiconductors. For example, a recent prior art related to such MRAM devices includes the following Patent Publications 1, 2 and 3.

Patent Publication 1: Japanese Patent Laid-Open Publication No. 11-135857 (Patent No. 3050189)

Patent Publication 2: Japanese Patent Laid-Open Publication No. 2000-106462

Patent Publication 3: WO 01/024289 (domestic re-publication of PCT international publication for patent applications)

DISCLOSURE OF INVENTION

In the conventional MRAM using a TMR element formed of a thin film of metallic ferromagnetic material, a series connection as in a GMR element cannot be applied to the TMR element due to its high resistance, and a parallel connection has to be used therefor. Typically, in this type of MRAM, a MOS transistor is combined with the TMR element to form a memory cell, because in the absence of the MOS transistor, a current applied to bit and word lines will be supplied to not only a selected memory cell but also the remaining cells.

The MOS transistor is required to carry out a switching function essential in selecting an intended memory element. It is therefore a first object of the present invention to develop a MRAM capable of achieving high-integration in a simplified structure without any MOS transistor, by use of a p-n junction rectifier diode, or a p-i-n junction rectification, formed of half-metallic ferromagnetic semiconductors, in place of a MOS transistor for carrying out a switching function essential in selecting an intended memory element.

In view of the fact that the memory size of the MRAM is determined by the dimensional size of the MOS transistor, the exclusion of the MOS transistor from the MRAM can provide a MRAM with a drastically increased degree of integration.

At present, a TMR element using a thin film of metallic ferromagnetic material has a MR rate of about 50%. This MR rate is not varied depending on the dimensions of the TMR element. It is a second object of the present invention to develop a new type of high-performance MRAM with a significantly increased MR rate of 100% to 500% by use of p-type and n-type half-metallic ferromagnetic semiconductors having only completely or 100% spin-polarized carriers.

As to a heat stability of the TMR element using a thin film of metallic ferromagnetic material, while a maximum MR rate is achieved at an annealing treatment temperature of 300° C., the conventional MRAM has to be typically subjected to a heat treatment at a temperature of 400° C. in a hydrogen atmosphere to recover damages in a CMOS transistor due to microfabrication and/or patterning of metal wirings. During this heat treatment, the MR rate of the TMR element becomes zero. Thus, it is required to improve the heat resistance of the TMR element or reduce the temperature for the heat treatment of the CMOS transistor. In a MRAM including no MOS transistor, the MRAM can be processed at a high temperature during production process. Particularly, a TMR element using a magnetic semiconductor has a heat stability sufficient to positively utilize a maximum MR ratio achieved at a high annealing temperature of 500° C. or more.

In the conventional MRAM using a thin film of metallic ferromagnetic material, the intensity of a current magnetic field required for magnetization inversion is increased as a memory cell size is reduced. It is a third object of the present invention to solve this problem so as to achieve a larger-capacity MRAM.

The conventional MRAM using a thin film of metallic ferromagnetic material involves another problem about microfabrication therefor. Specifically, while the thin film is microfabricated through physical cutting by means of lithography and ion milling ion as a technique for research, such a technique cannot be applied to large-scale productions. It is a fourth object of the present invention to solve this problem.

A MRAM using a half-metallic ferromagnetic semiconductor allows a production technique based on a dry etching process or chemical reaction etching commonly used for semiconductors, to be applied thereto. Thus, such a production technique for semiconductors can be utilized to develop a technique essential to the large-scale production of MRAM devices.

Through various researches for achieving the above objects, the inventors have achieved a p-i-n type low-resistance tunneling-magnetoresistance-effect (low-resistance TMR) diode in which at least three atomic layers of nonmagnetic insulator (i-layers) are interposed between a p-type half-metallic ferromagnetic semiconductor and an n-type half-metallic ferromagnetic semiconductor, to provide a reduced resistance.

It was also verified that this low-resistance TMR diode exhibits a rectification effect of allowing a current to flow in only one direction in response to applying a voltage to bit and word lines. This means that a new type of magnetoresistive random-access memory (MRAM) using p-type and n-type half-metallic ferromagnetic semiconductors can be adequately operated without any switching MOS transistor.

Further, the inventors have found that a p-n junction type low-resistance tunneling-magnetoresistance-effect (low-resistance TMR) diode based on the junction between a p-type half-metallic ferromagnetic semiconductor and an n-type half-metallic ferromagnetic semiconductor can achieve the same effect to provide a new type of magnetoresistive random-access memory (MRAM) using half-metallic ferromagnetic semiconductors operable without any MOS transistor.

A MRAM using ZnO-based p-type and n-type half-metallic dilute ferromagnetic semiconductors can be fundamentally produced through a conventional semiconductor production technique, such as a laser MBE (Molecular Beam Epitaxy) process or a MOCVD (Metalorganic Chemical Vapor Deposition) process at 200° C. In conjunction with doping of a transition metal, such as Cr or V, in an amount of 10 to 15 atomic % during crystal growth, a crystal growth temperature is set at a lower temperature of about 200° C. as compared to a usual crystal growth temperature for ZnO itself. This makes it possible to employ a production technique based on a dry etching process or chemical reaction etching commonly used in the production process of semiconductors. Based on such a production technique, a method of the present invention has been accomplished as a practical technique allowing a MRAM device including no transistor to be produced in large quantities.

Specifically, as described below, the present invention provides a new type of magnetoresistive random-access memory (MRAM) device using a magnetic semiconductor and including no MOS transistor, and a production method therefor.

(1) A magnetoresistive random-access memory (MRAM) device comprises a p-i-n type low-resistance tunneling-magnetoresistance-effect (low-resistance TMR) diode which includes a p-type half-metallic ferromagnetic semiconductor, an n-type half-metallic ferromagnetic semiconductor and at least one atomic layer of nonmagnetic insulator (i-layer) interposed therebetween. The diode has a rectification effect so as to provide a TMR element with a switching function based on the rectification effect.

(2) A magnetoresistive random-access memory (MRAM) device comprises a p-type half-metallic ferromagnetic semiconductor and an n-type half-metallic ferromagnetic semiconductor which are joined together to create a p-n junction type low-resistance tunneling-magnetoresistance effect (low-resistance TMR) so as to provide a TMR element with a switching function based on a rectification effect.

(3) A magnetoresistive random-access memory (MRAM) device comprises a p-type half-metallic ferromagnetic semiconductor formed by doping Cr and a hole in a group II-VI compound semiconductor (ZnSe, ZnS, ZnTe, ZnO, CdTe, CdS, CdSe, etc.), and an n-type half-metallic ferromagnetic semiconductor formed by doping V and an electron in the group II-VI compound semiconductor, which are joined together to form a p-n junction type low-resistance tunneling-magnetoresistance-effect (low-resistance TMR) diode having a rectification effect so as to provide a TMR element with a switching function based on the rectification effect.

(4) A magnetoresistive random-access memory (MRAM) device comprises a p-type half-metallic ferromagnetic semiconductor formed by doping Mn and a hole in a group III-V compound semiconductor (GaAs, GaN, GaSb, InN, InAs, InSb, AlN, AlSb, AlAs, etc.), and an n-type half-metallic ferromagnetic semiconductor formed by doping Cr and an electron in the group III-V compound semiconductor, which are joined together to form a p-n junction type low-resistance tunneling-magnetoresistance-effect (low-resistance TMR) diode having a rectification effect so as to provide a TMR element with a switching function based on the rectification effect.

(5) A magnetoresistive random-access memory (MRAM) device comprises a p-i-n type low-resistance tunneling-magnetoresistance-effect (low-resistance TMR) diode which includes a p-type half-metallic ferromagnetic semiconductor formed by doping Cr and a hole in a group II-VI compound semiconductor (ZnSe, ZnS, ZnTe, ZnO, CdTe, CdS, CdSe, etc.), an n-type half-metallic ferromagnetic semiconductor formed by doping V and an electron in the group II-VI compound semiconductor, and at least one atomic layer of nonmagnetic insulator (i-layer) interposed therebetween. The diode has a rectification effect so as to provide a TMR element with a switching function based on the rectification effect.

(6) A magnetoresistive random-access memory (MRAM) device comprises a p-i-n type low-resistance tunneling-magnetoresistance-effect (low-resistance TMR) diode which includes a p-type half-metallic ferromagnetic semiconductor formed by doping Mn and a hole in a group III-V compound semiconductor (GaAs, GaN, GaSb, InN, InAs, InSb, AlN, AlSb, AlAs, etc.), an n-type half-metallic ferromagnetic semiconductor formed by doping Cr and an electron in the group III-V compound semiconductor, and at least one atomic layer of nonmagnetic insulator (i-layer) interposed therebetween. The diode has a rectification effect so as to provide a TMR element with a switching function based on the rectification effect.

(7) A magnetoresistive random-access memory (MRAM) device comprises a p-i-n type low-resistance tunneling-magnetoresistance-effect (low-resistance TMR) diode which includes a p-type half-metallic ferromagnetic semiconductor formed of ZnO doped with Cr and a hole, an n-type half-metallic ferromagnetic semiconductor formed of ZnO doped with an electron and either one selected from the group consisting of V, Fe, Co and Ni, and at least one atomic layer of nonmagnetic insulator (i-layer) interposed therebetween. The diode has a rectification effect so as to provide a TMR element with a switching function based on the rectification effect.

(8) A magnetoresistive random-access memory (MRAM) device comprises a p-type half-metallic ferromagnetic semiconductor formed of ZnO doped with Cr and a hole, and an n-type half-metallic ferromagnetic semiconductor formed of ZnO doped with an electron and either one selected from the group consisting of V, Fe, Co and Ni, which are joined together to form a p-n junction type low-resistance tunneling-magnetoresistance-effect (low-resistance TMR) diode having a rectification effect so as to provide a TMR element with a switching function based on the rectification effect.

(9) A magnetoresistive random-access memory (MRAM) device comprises a p-i-n type low-resistance tunneling-magnetoresistance-effect (low-resistance TMR) diode which includes a p-type half-metallic ferromagnetic semiconductor formed by doping Fe and a hole in a group IV semiconductor (Si, Ge, diamond, etc.), an n-type half-metallic ferromagnetic semiconductor formed by doping Mn and an electron in the group IV semiconductor, and at least one atomic layer of nonmagnetic insulator (i-layer) interposed therebetween. The diode has a rectification effect so as to provide a TMR element with a switching function based on the rectification effect.

(10) A magnetoresistive random-access memory (MRAM) device comprises a p-type half-metallic ferromagnetic semiconductor formed by doping Fe and a hole in a substitution position of a group IV semiconductor (Si, Ge, diamond, etc.), and an n-type half-metallic ferromagnetic semiconductor formed by doping Mn and an electron in the group IV semiconductor, which are joined together to form a p-n junction type low-resistance tunneling-magnetoresistance-effect (low-resistance TMR) diode having a rectification effect so as to provide a TMR element with a switching function based on the rectification effect.

(11) A magnetoresistive random-access memory (MRAM) device comprises a p-type half-metallic ferromagnetic semiconductor formed by doping Mn and a hole in an interstitial position of a group IV semiconductor (Si, Ge, diamond, etc.), and an n-type half-metallic ferromagnetic semiconductor formed by doping Cr and an electron in the group IV semiconductor, which are joined together to form a p-n junction type low-resistance tunneling-magnetoresistance-effect (low-resistance TMR) diode having a rectification effect so as to provide a TMR element with a switching function based on the rectification effect.

(12) A method for producing either one of the aforementioned magnetoresistive random-access memory devices using the group III-V compound semiconductor-based half-metallic ferromagnetic semiconductors to provide a TMR element with a switching function based on a rectification effect of the p-i-n type or p-n type low-resistance tunneling-magnetoresistance-effect (low-resistance TMR) diode, which comprises changing the concentration of 3d, 4d and 5d transition metal impurities or a rare-earth impurity, or the concentration of a hole and electron, to control a ferromagnetic transition temperature of the ferromagnetic semiconductor constituting the TMR element.

(13) A method for producing either one of the aforementioned magnetoresistive random-access memory devices using the group II-VI compound semiconductor-based half-metallic ferromagnetic semiconductors to provide a TMR element with a switching function based on a rectification effect of the p-i-n type or p-n type low-resistance tunneling-magnetoresistance-effect (low-resistance TMR) diode, which comprises changing the concentration of 3d, 4d and 5d transition metal impurities or a rare-earth impurity, or the concentration of a hole and electron, to control a ferromagnetic transition temperature of the ferromagnetic semiconductor constituting the TMR element at a desired value.

In the conventional MRAM using a TMR element formed of a thin film of metallic ferromagnetic material, a series connection as in a GMR element cannot be applied to the TMR element due to its high resistance, and a parallel connection has to be used therefor. According to the present invention, a p-type half-metallic ferromagnetic semiconductor, an n-type half-metallic ferromagnetic semiconductor and at least one atomic layer of nonmagnetic insulator (i-layer) interposed therebetween are joined together to form a p-i-n type low-resistance tunneling-magnetoresistance-effect (low-resistance TMR) diode having a rectification effect. The rectification effect is utilized to assure a unidirectional current flow, and eliminate the need for providing a switching MOS transistor. This makes it possible to produce a new type of magnetoresistive random-access memory (MRAM) device using half-metallic ferromagnetic semiconductors and including no MOS transistor.

Alternatively, a p-type half-metallic ferromagnetic semiconductor and an n-type half-metallic ferromagnetic semiconductor are joined together to form a p-n junction type low-resistance tunneling-magnetoresistance-effect (low-resistance TMR) diode having the same rectification effect. This also makes it possible to produce a new type of magnetoresistive random-access memory (MRAM) device using half-metallic ferromagnetic semiconductors and including no MOS transistor.

Typically, in the conventional MRAM using a TMR element, a MOS transistor is combined with the TMR element to form a memory cell, because in the absence of the MOS transistor, a current applied to bit and word lines will be supplied to not only a selected memory cell but also the remaining cells. The MOS transistor is essentially required to carry out a switching function for selecting an intended memory element.

While the conventional MRAM is essentially required to have the MOS transistor with the switching function for selecting an intended memory element, the present invention can provide a MRAM in a simplified structure without any MOS transistor by use of a p-n junction spin-rectifier diode or p-i-n junction spin-rectifier diode formed of half-metallic ferromagnetic semiconductors. Thus, the present invention makes it possible to develop a highly integrated MRAM. In addition, the MRAM of the present invention has no need for the aforementioned production process for the MOS transistor, and thereby can be processed at a high temperature.

At present, a TMR element using a thin film of metallic ferromagnetic material has a MR rate of about 50%, and this MR rate is not varied depending on the dimensions of the TMR element. Instead of the thin film of metallic ferromagnetic material, the present invention employs the p-type and n-type half-metallic ferromagnetic semiconductor thin films to open the way for developing a high-performance MRAM having a significantly increased MR ratio.

As to a heat stability of the TMR element using a thin film of metallic ferromagnetic material, while a maximum MR rate is achieved at an annealing temperature of 300° C., the conventional MRAM has to be typically subjected to a heat treatment at a temperature of 400° C. in a hydrogen atmosphere to recover damages in a CMOS transistor due to microfabrication and/or patterning of metal wirings. During this heat treatment, the MR rate of the TMR element becomes zero. Thus, it is required to improve the heat resistance of the TMR element or reduce the temperature for the heat treatment of the CMOS transistor. The MRAM of the present invention including no MOS transistor can be processed at a high temperature during production process. That is, the heat stability of the half-metallic ferromagnetic semiconductor-based TMR element is sufficient to positively utilize a maximum MR ratio (100% to 500%) achieved at a high heat treatment temperature of 500° C. or more. Thus, as compared with the conventional MRAM based on the TMR element using a metal magnetic material, the half-metallic ferromagnetic semiconductor-based MRAM of the present invention can achieve extremely high performance and integration.

In the conventional MRAM using a thin film of metallic ferromagnetic material, the intensity of a current magnetic field required for magnetization inversion is increased as a memory cell size is reduced. This was a problem in achieving a larger-capacity MRAM using a metallic magnetic material. In the half-metallic ferromagnetic semiconductor-based MRAM of the present invention, even if the MRAM is highly integrated to have a reduced size, the intensity of a current magnetic field required for magnetization inversion can be reduced by several digits or more as compared with the conventional MRAM using a thin film of metallic ferromagnetic material, to solve the above problem.

While a thin film of metallic ferromagnetic material in the conventional MRAM is microfabricated through physical cutting by means of lithography and ion milling ion as a technique for research, such a technique cannot be applied to large-scale productions. The half-metallic ferromagnetic semiconductor-based MRAM of the present invention can be fundamentally produced at a process temperature equal to or less than that in a conventional semiconductor production process. Thus, the present invention employs a production technique based on a dry etching process or chemical reaction etching commonly used for semiconductors to achieve a practical technique allowing the large-scale production of MRAM devices.

BEST MODE FOR CARRYING OUT THE INVENTION

Figure 1:
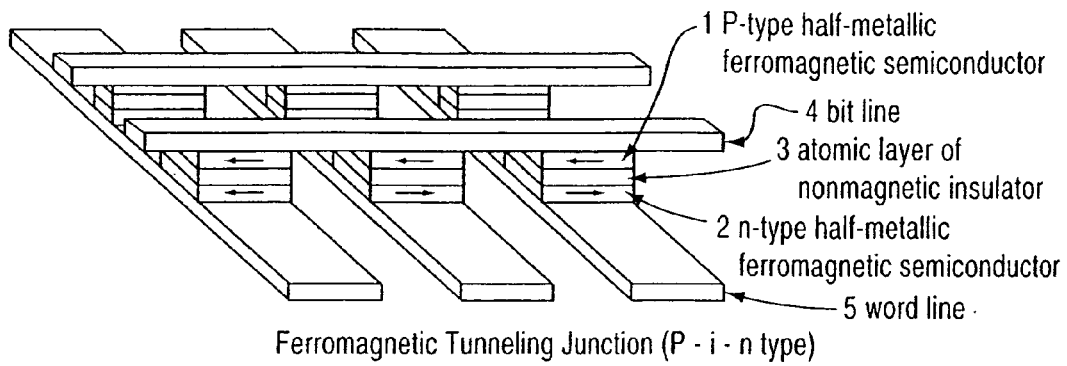
FIG. 1 is a schematic diagram showing a new type of magnetoresistive random-access memory (MRAM) device which comprises a p-i-n type low-resistance tunneling-magnetoresistance-effect (low-resistance TMR) rectifier diode with a structure having a p-type half-metallic ferromagnetic semiconductor, an n-type half-metallic ferromagnetic semiconductor and at least one atomic layer of nonmagnetic insulator interposed therebetween.

In the conventional MRAM using a TMR element formed of a thin film of metallic ferromagnetic material, a series connection as in a GMR element cannot be applied to the TMR element due to its high resistance, and a parallel connection has to be used therefor. In order to reduce the resistance, as shown in FIG. 1, a p-i-n type low-resistance tunneling-magnetoresistance-effect (low-resistance TMR) diode was prepared using a p-type half-metallic ferromagnetic semiconductor 1, an n-type half-metallic ferromagnetic semiconductor 2 and at least one atomic layer of nonmagnetic insulator (i-layer) 3 interposed therebetween.

It was also verified that this low-resistance TMR diode exhibits a rectification effect of allowing a current to flow in only one direction in response to applying a voltage to a bit line 4 and a word line 5. This means that a new type of magnetoresistive random-access memory (MRAM) using p-type and n-type half-metallic ferromagnetic semiconductors can be adequately operated without any switching MOS transistor.

Figure 2:
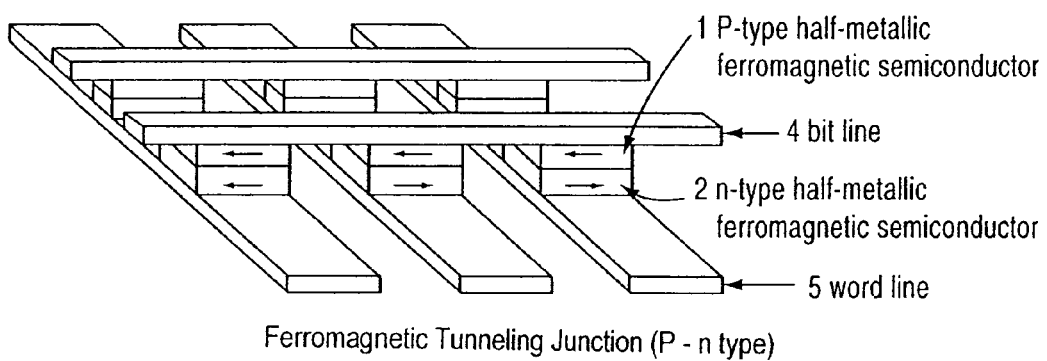
FIG. 2 is a schematic diagram showing a new type of magnetoresistive random-access memory (MRAM) device which comprises a p-n type low-resistance tunneling-magnetoresistance-effect (low-resistance TMR) rectifier diode with a structure having a p-type half-metallic ferromagnetic semiconductor and an n-type half-metallic ferromagnetic semiconductor, and no interposition of the atomic layer of nonmagnetic insulator.

Further, as shown in FIG. 2, a p-n junction type low-resistance tunneling-magnetoresistance-effect (low-resistance TMR) diode was prepared by joining a p-type half-metallic ferromagnetic semiconductor 1 and an n-type half-metallic ferromagnetic semiconductor 2. This low-resistance TMR diode has the same rectification effect capable of providing a new type of magnetoresistive random-access memory (MRAM) using half-metallic ferromagnetic semiconductors which is adequately operated without any MOS transistor.

Figure 3:
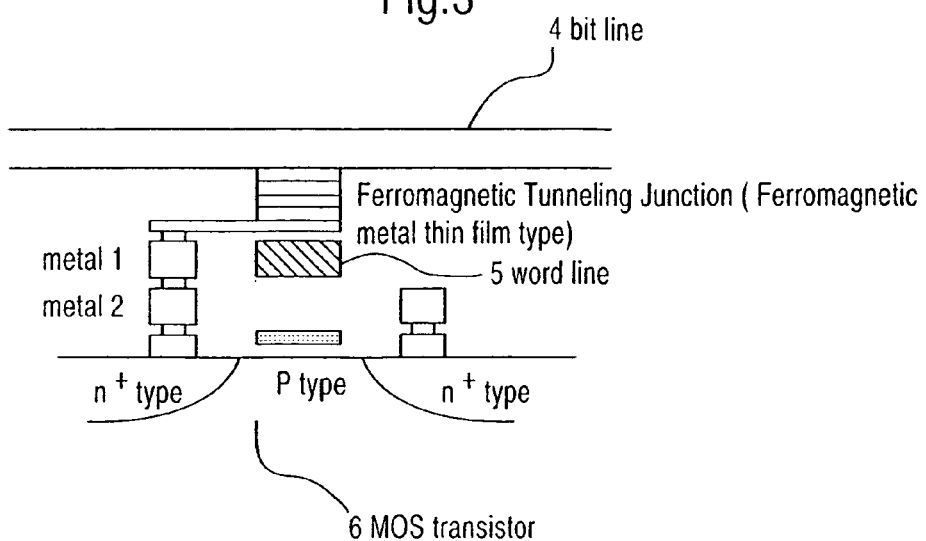
FIG. 3 is a schematic diagram showing a MRAM using a conventional TMR element.

As shown in FIG. 3, in the conventional MRAM using a TMR element formed of a thin film of metallic ferromagnetic material, a MOS transistor 6 is combined with the TMR element to form a memory cell, because in the absence of the MOS transistor 6, a current applied to a bit line 4 and a word line 5 will be supplied to not only a selected memory cell but also the remaining cells. In the MRAM of the present invention, the rectification effect of the p-i-n type or p-n junction type low-resistance tunneling-magnetoresistance-effect (low-resistance TMR) diode can control the current to flow in one direction from the bit line to the ward line. This eliminates the need for providing a MOS transistor to carry out a switching function for selecting an intended memory element as in the conventional MRAM.

Figure 4:
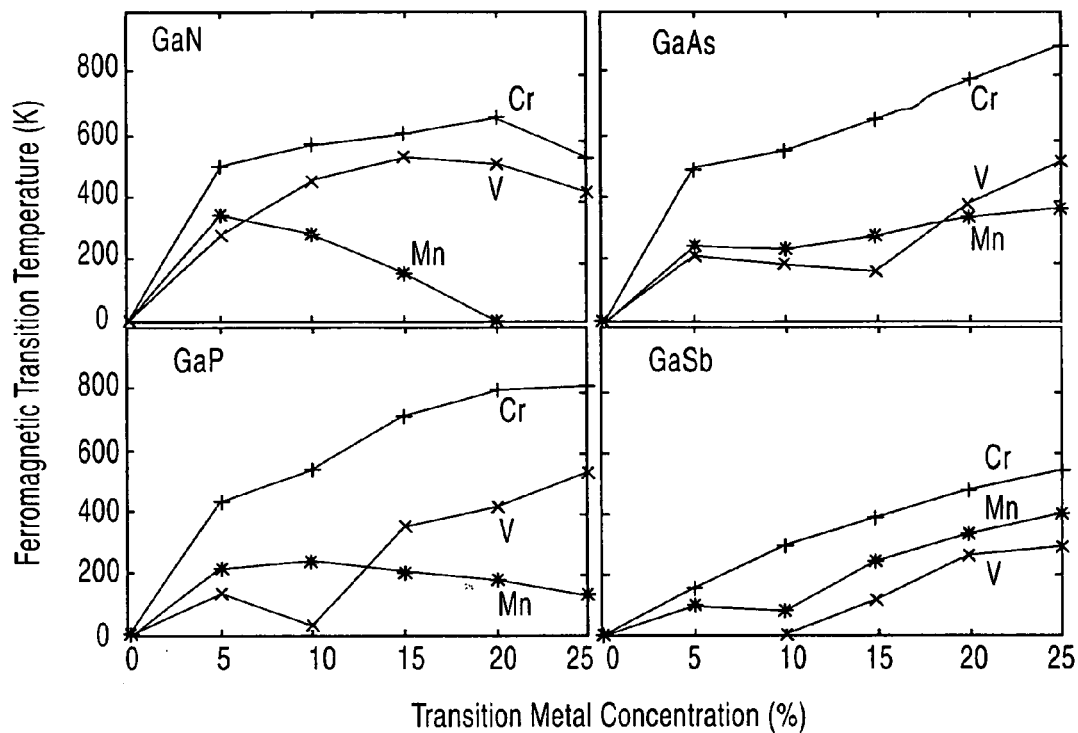
FIG. 4 is a graph showing the relationship between the concentration of a 3d transition metal impurity and the ferromagnetic transition temperature of a ferromagnetic semiconductor constituting a TMR element, in a magnetoresistive random-access memory (MRAM) of the present invention to be prepared using a group III-V compound semiconductor-based half-metallic ferromagnetic semiconductor.

FIG. 4 is a graph showing the relationship between the concentration of a 3d transition metal impurity and the ferromagnetic transition temperature (K) of a ferromagnetic semiconductor constituting a TMR element, in a magnetoresistive random-access memory (MRAM) to be prepared using a group III-V compound semiconductor-based half-metallic ferromagnetic semiconductor so as to provide a switching function to the TMR element on the basis of the rectification effect of the aforementioned p-i-n type or p-n type low-resistance tunneling-magnetoresistance-effect (low-resistance TMR) diode.

Figure 5:
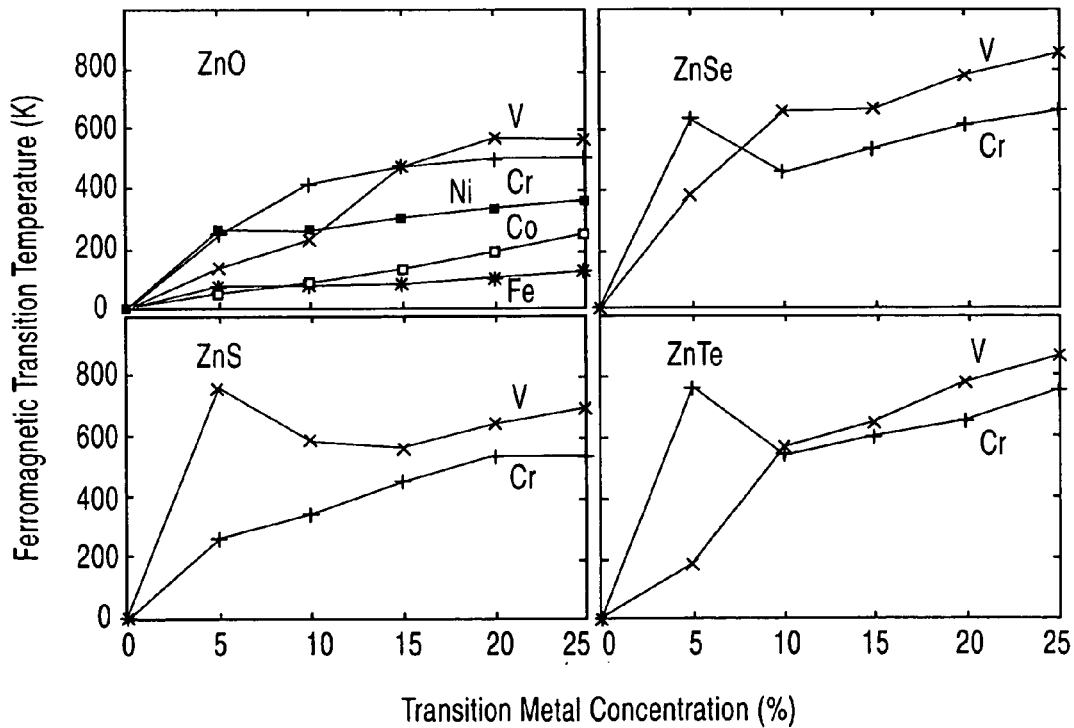
FIG. 5 is a graph showing the relationship between the concentration of a 3d transition metal impurity and the ferromagnetic transition temperature of a ferromagnetic semiconductor constituting a TMR element, in a magnetoresistive random-access memory (MRAM) of the present invention to be prepared using a group II-VI compound semiconductor-based half-metallic ferromagnetic semiconductor.

FIG. 5 is a graph showing the relationship between the concentration of a 3d transition metal impurity and the ferromagnetic transition temperature (K) of a ferromagnetic semiconductor constituting a. TMR element, in a magnetoresistive random-access memory (MRAM) to be prepared using a group II-VI compound semiconductor-based half-metallic ferromagnetic semiconductor so as to provide a switching function to the TMR element on the basis of the rectification effect of the aforementioned p-i-n type or p-n type low-resistance tunneling-magnetoresistance-effect (low-resistance TMR) diode.

In the present invention, the rectification effect induced by the p-n junction between the p-type and n-type half-metallic ferromagnetic semiconductors or the p-i-n junction is utilized to provide a significantly simplified structure without any MOS transistor. Thus, the present invention makes it possible to develop a highly integrated MRAM. In addition, the MRAM of the present invention has no need for the production process for the MOS transistor, and thereby a highly integrated MRAM can be produced at high process temperature.

At present, a TMR element using a thin film of metallic ferromagnetic material has a MR rate of about 50%, and this MR rate is not varied depending on the dimensions of the TMR element. In a case where p-type and n-type half-metallic ferromagnetic semiconductors are used in place of the metallic magnetic material, while the junction have a metallic conduction in one spin state, the band gap is opened in the reverse spin state and thereby the junction goes in an insulating state where no carrier exists. Thus, a spin conduction in completely or 100% spin polarized state can be obtained.

Figure 6:
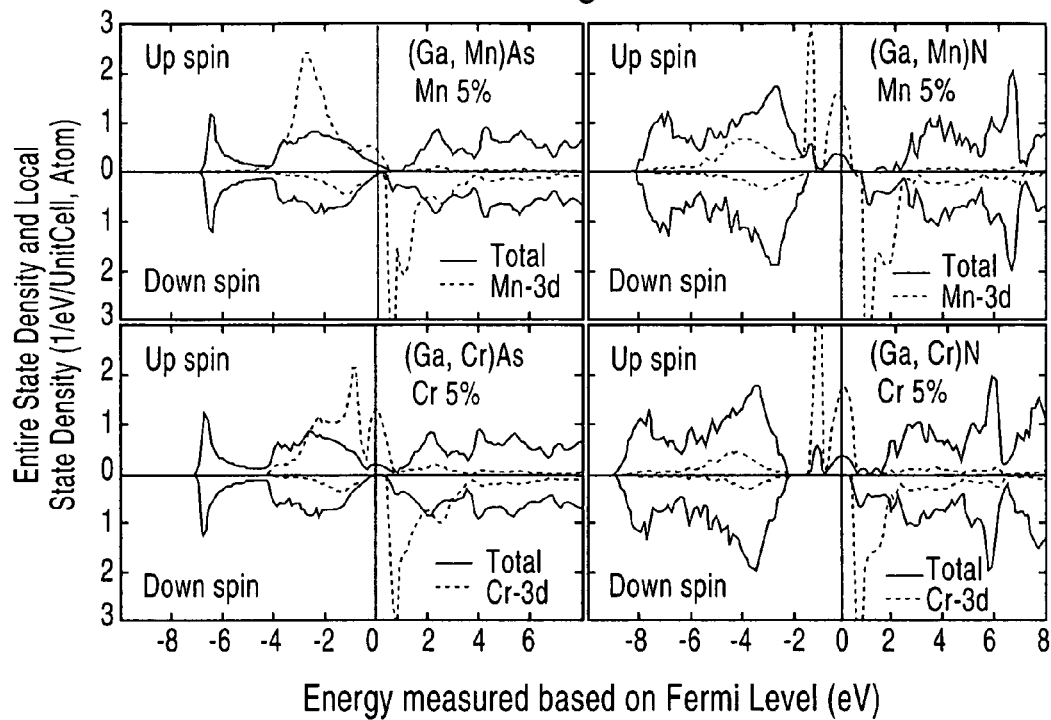
FIG. 6 is a graph showing a half-metallic electronic state in each of p-type (Mn-doped) and n-type (Cr-doped) group III-V dilute magnetic semiconductors (GaAs, GaN) (one spin state is in a half-metallic state, and the reverse spin state is in an insulating state).

FIG. 6 shows a half-metallic electronic state in each of p-type (Mn-doped) and n-type (Cr-doped) group III-V dilute magnetic semiconductors (GaAs, GaN), wherein one spin state is in a half-metallic state, and the reverse spin state is in an insulating state.

Figure 7:
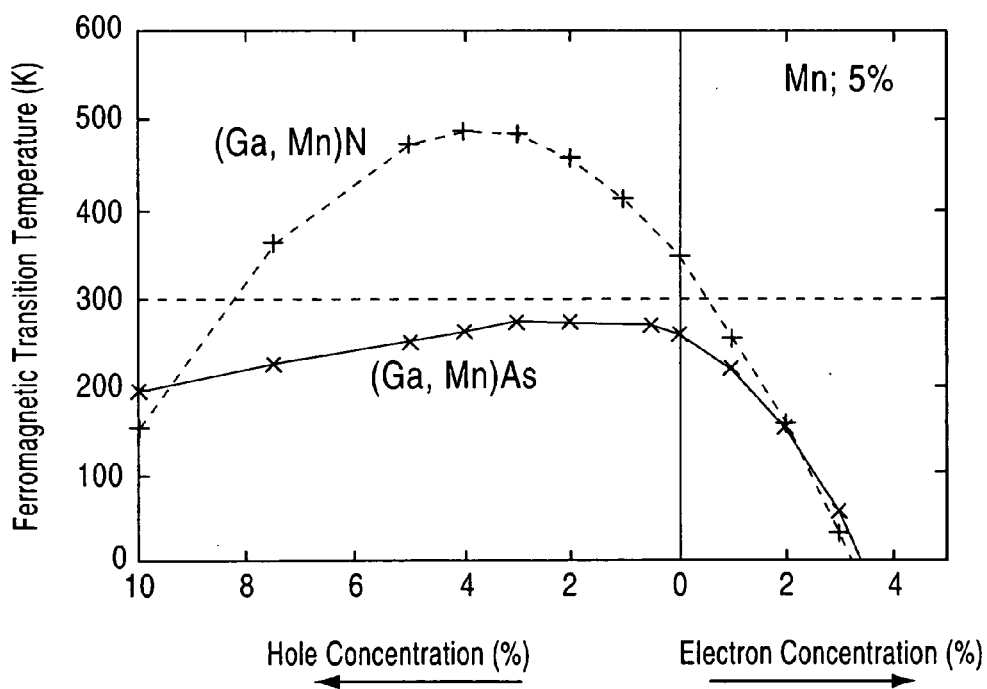
FIG. 7 is a graph showing hole and electron concentration dependences of a ferromagnetic transition temperature of a p-type (5% Mn-doped) group III-V dilute magnetic semiconductor (GaAs, GaN).

FIG. 7 shows hole and electron concentration dependences of a ferromagnetic transition temperature of a p-type (5% Mn-doped) group III-V dilute magnetic semiconductor (GaAs, GaN).

Figure 8:
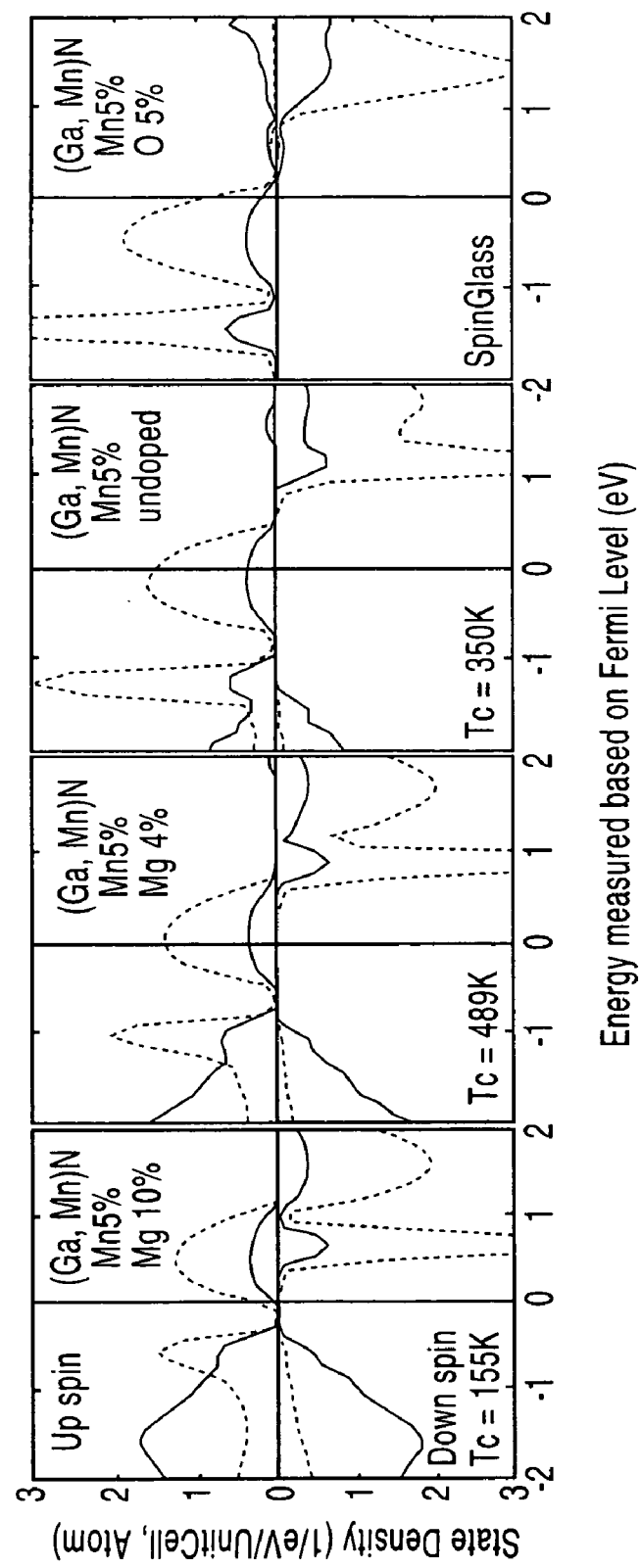
FIG. 8 is a graph showing acceptor (Mg) and donor (O) concentration dependences of a half-metallic electronic state of a (5% Mn-doped) group III-V dilute magnetic semiconductor (GaAs, GaN).

FIG. 8 shows acceptor (Mg) and donor (O) concentration dependences of a half-metallic electronic state of a (5% Mn-doped) group III-V dilute magnetic semiconductor (GaAs, GaN).

A structure obtained by sandwiching one to several atomic layers of insulator between p-type and n-type half-metallic ferromagnetic semiconductors can provide a large MR rate of 100 to 500% or more. The half-metallic state can be positively utilized to obtain a significantly large MR rate (while the MR rate is practically in the range of 100 to 500%, an infinitely large MR rate can be obtained in theory in view of 100% spin polarized carriers) so as to achieve a high-performance MRAM having a significantly increased MR rate.

As to a heat stability of the TMR element using a thin film of metallic ferromagnetic material, while a maximum MR rate is achieved at an annealing temperature of 300° C., the conventional MRAM has to be typically subjected to a heat treatment at a temperature of 400° C. in a hydrogen atmosphere to recover damages in a CMOS transistor due to microfabrication and/or patterning of metal wirings. During this heat treatment, the MR rate of the TMR element becomes zero. Thus, it is required to improve the heat resistance of the TMR element or reduce the temperature for the heat treatment of the CMOS transistor. In the MRAM of the present invention, a TMR element includes either one of a combination of n-type (Ga, Cr) N and p-type (Ga, Mn) N (insulator i-layer: GaN), a combination of n-type (Ga, Cr) As and p-type (Ga, Mn) As (insulator i-layer: GaAs), and a p-n junction rectifier diode devoid of the i-layer, without including any MOS transistor during its production process. Thus, the MRAM of the present invention can be produced at a high process temperature.

That is, the heat stability of a TMR element of GaN or ZnO-based p-type and n-type half-metallic ferromagnetic semiconductors is sufficient to positively utilize a maximum MR ratio (100% to 500%) achieved at a high annealing temperature of 700° C. or more. Thus, as compared with the conventional MRAM based on the TMR element using a thin film of metal ferromagnetic material, the new type of half-metallic ferromagnetic semiconductor-based MRAM of the present invention having no need for providing a MOS transistor can achieve extremely high performance and integration.

In the conventional MRAM using a thin film of metallic ferromagnetic material, the intensity of a current magnetic field required for magnetization inversion is increased as a memory cell size is reduced. This was a problem in achieving a larger-capacity MRAM using a metallic ferromagnetic material. In contrast, when a half-metallic dilute ferromagnetic semiconductor having an extremely low concentration (2 to 30 atomic %) of a magnetic element is used to produce a highly integrated MRAM having a reduced size, the intensity of a current magnetic field required for magnetization inversion can be reduced by several digits or more as compared with the conventional MRAM using a thin film of metallic magnetic material. Based on this advantage, the half-metallic ferromagnetic semiconductor-based MRAM of the present invention can solve the above problem.

While a thin film of metallic ferromagnetic material in the conventional MRAM is microfabricated through physical cutting by means of lithography and ion milling ion as a technique for research, such a technique cannot be applied to large-scale productions. A MRAM using GaN-based p-type and n-type half-metallic ferromagnetic semiconductors can be fundamentally produced through a conventional semiconductor production process, such as a MBE process using an ammonia gas source, a MBE process using an ECR (Electron Cyclotron Resonance) plasma source, or a MOCVD process, at a process temperature of 700 to 750° C.

In conjunction with doping of a transition metal, such as Cr or Mn, in an amount of 2 to 30 atomic % during crystal growth, a crystal growth temperature is reduced by about 200° C. as compared to a usual crystal growth temperature for GaN itself. The resulting lowered process temperature makes it possible to employ a production technique based on a dry etching process or chemical reaction etching commonly used for semiconductors. Thus, the present invention can achieve a practical technique for allowing the large-scale production of MRAM devices including no MOS transistor.

EXAMPLE

Example 1

—Preparation of MRAM Using n-type (Ga, Cr) N and p-type (Ga, Mn) N Half-Metallic Dilute Ferromagnetic Semiconductors—

In order to reduce the resistance of a TMR element, a p-i-n type low-resistance tunneling-magnetoresistance-effect (low-resistance TMR) diode was prepared using p-type (Ga, Mn) N (the concentration of Mn: 10 atomic %) as a p-type half-metallic dilute ferromagnetic semiconductor, n-type (Ga, Cr) N (the concentration of Cr: 10 atomic %) as an n-type half-metallic dilute ferromagnetic semiconductor, and two atomic layers of nonmagnetic insulator GaN (i-layers) interposed therebetween, as shown in FIG. 1.

It was verified that the new type of TMR element exhibits a rectification effect of allowing a rectified current to flow in only one direction in response to applying a low voltage of 5 to 20 meV to bit and word lines. This means that a new type of magnetoresistive random-access memory (MRAM) using p-type and n-type half-metallic dilute ferromagnetic semiconductors can be adequately operated without any switching MOS transistor.

As compared with the conventional MRAM using a thin film of metallic ferromagnetic martial, the bias voltage can be drastically reduced by one digit or more at room temperatures by taking advantage of a lowered resistance of the TMR element. In addition, a writing/reading time is reduced to 0.2 to 1.3 ns.

Further, a p-n junction type low-resistance tunneling-magnetoresistance-effect (low-resistance TMR) rectifier diode was prepared by joining p-type (Ga, Mn) N (the concentration of Mn: 6 atomic %) as a p-type half-metallic dilute ferromagnetic semiconductor, and n-type (Ga, Cr) N (the concentration of Cr: 6 atomic %) as an n-type half-metallic dilute ferromagnetic semiconductor, as shown in FIG. 2. This low-resistance TMR diode had the same rectification effect capable of providing a new type of magnetoresistive random-access memory (MRAM) using half-metallic dilute ferromagnetic semiconductors which is adequately operated without any MOS transistor.

In the conventional MRAM using a thin film of metallic ferromagnetic material, the intensity of a current magnetic field required for magnetization inversion is increased as a memory cell size is reduced. This was a problem in achieving a larger-capacity MRAM using a metallic ferromagnetic material. By contrast, in the new type of MRAM prepared using the half-metallic dilute ferromagnetic semiconductor having an extremely low concentration (6 atomic % or 10 atomic %) of the magnetic element to achieve high integration and reduction in size, the intensity of a current magnetic field required for magnetization inversion could be reduced to 1/10 to 1/100 or more of that in the conventional MRAM using a thin film of metallic magnetic material. Thus, the above problem could be solved in the new type of MRAM using half-metallic dilute ferromagnetic semiconductors.

Example 2

—Preparation of MRAM Using n-Type (Zn, V) O and p-Type (Zn, Cr) O Half-Metallic Dilute Ferromagnetic Semiconductors—

In order to reduce the resistance of a TMR element, a p-i-n type low-resistance tunneling-magnetoresistance-effect (low-resistance TMR) diode was prepared using p-type (Zn, Cr) O (the concentration of Cr: 10 atomic %) as a p-type half-metallic dilute ferromagnetic semiconductor, n-type (Zn, V) O (the concentration of V: 10 atomic %) as an n-type half-metallic dilute ferromagnetic semiconductor, and three atomic layers of nonmagnetic insulator ZnO (i-layers) interposed therebetween, as shown in FIG. 1.

It was verified that the new type of TMR element exhibits a rectification effect of allowing a rectified current to flow in only one direction in response to applying a low voltage of 8 to 25 meV to bit and word lines. This means that a new type of magnetoresistive random-access memory (MRAM) using p-type and n-type half-metallic dilute ferromagnetic semiconductors can be adequately operated without any switching MOS transistor.

As compared with the conventional MRAM using a thin film of metallic ferromagnetic martial, the bias voltage can be drastically reduced by one digit or more at room temperatures by taking advantage of a lowered resistance of the TMR element. In addition, a writing/reading time is reduced to 0.16 to 2.3 ns.

Further, a p-n junction type low-resistance tunneling-magnetoresistance-effect (low-resistance TMR) rectifier diode was prepared by joining p-type (Zn, Cr) O (the concentration of Cr: 15 atomic %) as a p-type half-metallic dilute ferromagnetic semiconductor, and n-type (Zn, V) O (the concentration of V: 15 atomic %) as an n-type half-metallic dilute ferromagnetic semiconductor, as shown in FIG. 2. This low-resistance TMR diode had the same rectification effect capable of providing a new type of magnetoresistive random-access memory (MRAM) using half-metallic dilute ferromagnetic semiconductors which is adequately operated without any MOS transistor.

In the conventional MRAM using a thin film of metallic ferromagnetic material, the intensity of a current magnetic field required for magnetization inversion is increased as a memory cell size is reduced. This was a problem in achieving a larger-capacity MRAM using a metallic ferromagnetic material. By contrast, in the new type of MRAM prepared using the half-metallic dilute ferromagnetic semiconductor having an extremely low concentration (10 atomic % or 15 atomic %) of the magnetic element to achieve high integration and reduction in size, the intensity of a current magnetic field required for magnetization inversion could be reduced to 1/10 to 1/100 or more of that in the conventional MRAM using a thin film of metallic magnetic material. Thus, the above problem could be solved in the new type of MRAM using half-metallic dilute ferromagnetic semiconductors.

INDUSTRIAL APPLICABILITY

In connection with the growing demand for mobile communications, and the all-in-one or integration of various functions, such as computer, videotelephone, database and data-mining, a future memory is required to increase in speed and capacity. In addition, along with the popularization of digital home appliances, the needs for nonvolatile memories is growing in view of energy saving. Among nonvolatile memories, a flash memory has disadvantages about a low writing speed, restriction on the number of rewriting operations and high power consumption. Further, in a ferroelectric memory, an allowable number of rewriting operations is about $10^{12}$, and a 10-year guarantee has not been achieved. These memories also have difficulties in high densification.

In contrast, the MRAM of the present invention is completely free of the above problems. Thus, in the future, it is highly possible that DRAMs will be replaced with MRAMs, and MRAMs will be a top-priority technical field of industrial application.

What is claimed is:

1. A magnetoresistive random-access memory device comprising a p-type half-metallic ferromagnetic semiconductor and an n-type half-metallic ferromagnetic semiconductor which are joined together to create a p-n junction type low-resistance tunneling-magnetoresistance effect (low-resistance TMR) so as to provide a TMR element with a switching function based on a rectification effect.

2. A magnetoresistive random-access memory device comprising a p-type half-metallic ferromagnetic semiconductor formed by doping Cr and a hole in a group II-VI compound semiconductor, and an n-type half-metallic ferromagnetic semiconductor formed by doping V and an electron in said group II-VI compound semiconductor, which are joined together to form a p-n junction type low-resistance tunneling-magnetoresistance-effect (low-resistance TMR) diode having a rectification effect so as to provide a TMR element with a switching function based on said rectification effect.

3. A magnetoresistive random-access memory device comprising a p-type half-metallic ferromagnetic semiconductor formed by doping Mn and a hole in a group III-V compound semiconductor, and an n-type half-metallic ferromagnetic semiconductor formed by doping Cr and an electron in said group III-V compound semiconductor, which are joined together to form a p-n junction type low-resistance tunneling-magnetoresistance-effect (low-resistance TMR) diode having a rectification effect so as to provide a TMR element with a switching function based on said rectification effect.

4. A magnetoresistive random-access memory device comprising a p-i-n type low-resistance tunneling-magnetoresistance-effect (low-resistance TMR) diode which includes a p-type half-metallic ferromagnetic semiconductor formed by doping Cr and a hole in a group II-VI compound semiconductor, an n-type half-metallic ferromagnetic semiconductor formed by doping V and an electron in said group II-VI compound semiconductor, and at least one atomic layer of nonmagnetic insulator (i-layer) interposed therebetween, said diode having a rectification effect so as to provide a TMR element with a switching function based on said rectification effect.

5. A magnetoresistive random-access memory device comprising a p-i-n type low-resistance tunneling-magnetoresistance-effect (low-resistance TMR) diode which includes a p-type half-metallic ferromagnetic semiconductor formed by doping Mn and a hole in a group III-V compound semiconductor, an n-type half-metallic ferromagnetic semiconductor formed by doping Cr and an electron in said group III-V compound semiconductor, and at least one atomic layer of nonmagnetic insulator (i-layer) interposed therebetween, said diode having a rectification effect so as to provide a TMR element with a switching function based on said rectification effect.

6. A magnetoresistive random-access memory device comprising a p-i-n type low-resistance tunneling-magnetoresistance-effect (low-resistance TMR) diode which includes a p-type half-metallic ferromagnetic semiconductor formed of ZnO doped with Cr and a hole, an n-type half-metallic ferromagnetic semiconductor formed of ZnO doped with an electron and either one selected from the group consisting of V, Fe, Co and Ni, and at least one atomic layer of nonmagnetic insulator (i-layer) interposed therebetween, said diode having a rectification effect so as to provide a TMR element with a switching function based on said rectification effect.

7. A magnetoresistive random-access memory device comprising a p-type half-metallic ferromagnetic semiconductor formed of ZnO doped with Cr and a hole, and an n-type half-metallic ferromagnetic semiconductor formed of ZnO doped with an electron and either one selected from the group consisting of V, Fe, Co and Ni, which are joined together to form a p-n junction type low-resistance tunneling-magnetoresistance-effect (low-resistance TMR) diode having a rectification effect so as to provide a TMR element with a switching function based on said rectification effect.

8. A magnetoresistive random-access memory device comprising a p-i-n type low-resistance tunneling-magnetoresistance-effect (low-resistance TMR) diode which includes a p-type half-metallic ferromagnetic semiconductor formed by doping Fe and a hole in a group IV semiconductor, an n-type half-metallic ferromagnetic semiconductor formed by doping Mn and an electron in said group IV semiconductor, and at least one atomic layer of nonmagnetic insulator (i-layer) interposed therebetween, said diode having a rectification effect so as to provide a TMR element with a switching function based on said rectification effect.

9. A magnetoresistive random-access memory device comprising a p-type half-metallic ferromagnetic semiconductor formed by doping Fe and a hole in a substitution position of a group IV semiconductor, and an n-type half-metallic ferromagnetic semiconductor formed by doping Mn and an electron in said group IV semiconductor, which are joined together to form a p-n junction type low-resistance tunneling-magnetoresistance-effect (low-resistance TMR) diode having a rectification effect so as to provide a TMR element with a switching function based on said rectification effect.

10. A magnetoresistive random-access memory device comprising a p-type half-metallic ferromagnetic semiconductor formed by doping Mn and a hole in an interstitial position of a group IV semiconductor, and an n-type half-metallic ferromagnetic semiconductor formed by doping Cr and an electron in said group IV semiconductor, which are joined together to form a p-n junction type low-resistance tunneling-magnetoresistance-effect (low-resistance TMR) diode having a rectification effect so as to provide a TMR element with a switching function based on said rectification effect.

11. A method for producing the magnetoresistive random-access memory device using the group III-V compound semiconductor-based half-metallic ferromagnetic semiconductors to provide a TMR element with a switching function based on a rectification effect of the p-i-n type or p-n type low-resistance tunneling-magnetoresistance-effect (low-resistance TMR) diode, as defined in claim 3 or 5, said method comprising changing the concentration of 3d, 4d and 5d transition metal impurities or a rare-earth impurity, or the concentration of a hole and electron, to control a ferromagnetic transition temperature of the ferromagnetic semiconductor constituting said TMR element.

12. A method for producing the magnetoresistive random-access memory device using the group II-VI compound semiconductor-based half-metallic ferromagnetic semiconductors to provide a TMR element with a switching function based on a rectification effect of the p-i-n type or p-n type low-resistance tunneling-magnetoresistance-effect (low-resistance TMR) diode, as defined in either one of claims 2, 4, 6 and 7, said method comprising changing the concentration of 3d, 4d and 5d transition metal impurities or a rare-earth impurity, or the concentration of a hole and electron, to control a ferromagnetic transition temperature of the ferromagnetic semiconductor constituting said TMR element at a desired value.

* * * * *